(12) United States Patent
Yang et al.

(10) Patent No.: US 12,150,394 B2
(45) Date of Patent: Nov. 19, 2024

(54) MEMORY DEVICE STRUCTURE FOR REDUCING THERMAL CROSSTALK

(71) Applicant: Taiwan Semiconductor Manufacturing Company, Ltd., Hsinchu (TW)

(72) Inventors: Ching Ju Yang, Hsinchu (TW); Huan-Chieh Chen, Taichung (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 383 days.

(21) Appl. No.: 17/677,506

(22) Filed: Feb. 22, 2022

(65) Prior Publication Data

US 2023/0270024 A1    Aug. 24, 2023

(51) Int. Cl.
*H10N 70/00* (2023.01)
*H10B 63/00* (2023.01)
*H10N 70/20* (2023.01)

(52) U.S. Cl.
CPC ......... *H10N 70/8616* (2023.02); *H10B 63/24* (2023.02); *H10B 63/80* (2023.02); *H10N 70/063* (2023.02); *H10N 70/231* (2023.02)

(58) Field of Classification Search
CPC ............................ H10N 70/8616; H10B 63/24
See application file for complete search history.

(56) References Cited

U.S. PATENT DOCUMENTS

| | | | |
|---|---|---|---|
| 10,505,110 B2* | 12/2019 | Tsai | H10N 70/8616 |
| 11,437,571 B2* | 9/2022 | Kim | H10B 63/84 |
| 2009/0191367 A1* | 7/2009 | Chen | H10N 70/231 360/122 |
| 2012/0068136 A1* | 3/2012 | Park | H10N 70/231 257/3 |
| 2022/0115442 A1* | 4/2022 | Bae | H10N 70/011 |

OTHER PUBLICATIONS

U.S. Appl. No. 17/412,345, filed Aug. 26, 2021.

* cited by examiner

*Primary Examiner* — Mounir S Amer
(74) *Attorney, Agent, or Firm* — Eschweiler & Potashnik, LLC

(57) ABSTRACT

The present disclosure is directed towards an integrated chip including a first memory cell overlying a substrate. The first memory cell comprises a first data storage layer. A second memory cell is adjacent to the first memory cell. A dielectric layer is disposed laterally between the first memory cell and the second memory cell. An air gap is disposed within the dielectric layer. The air gap is spaced laterally between the first memory cell and the second memory cell.

20 Claims, 12 Drawing Sheets

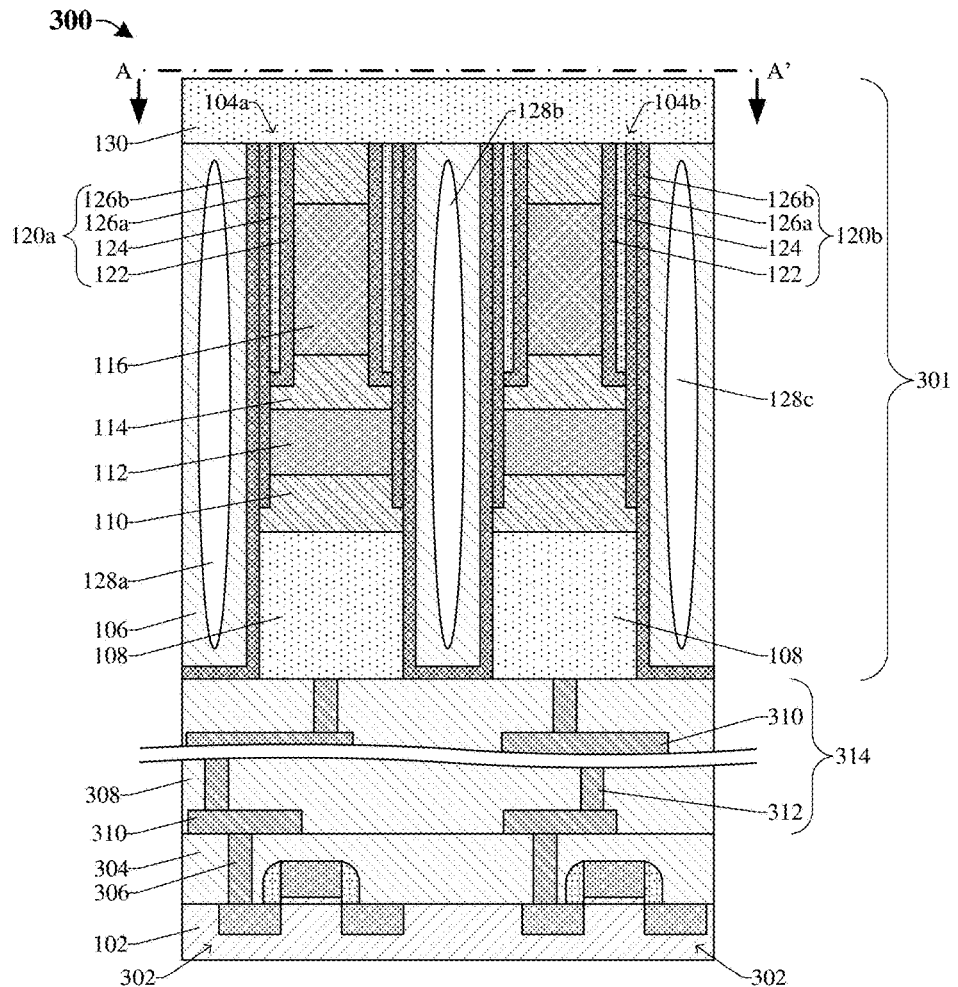
Fig. 3A
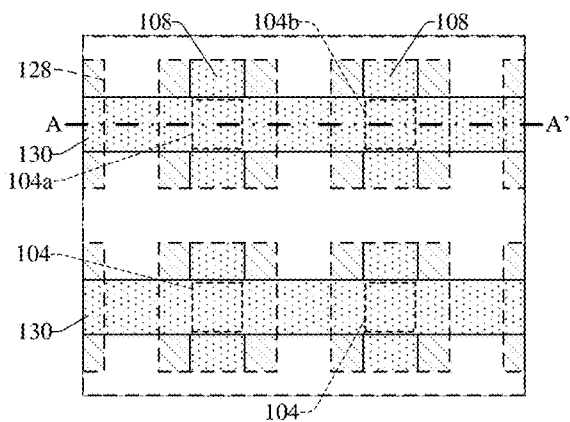 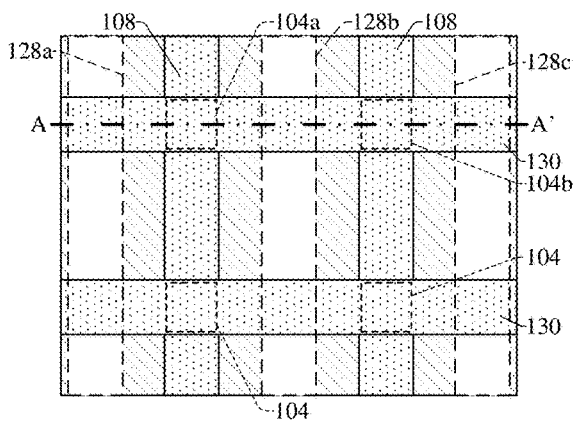
Fig. 3B              Fig. 3C

MEMORY DEVICE STRUCTURE FOR REDUCING THERMAL CROSSTALK

BACKGROUND

Many electronic devices contain electronic memory configured to store data. Electronic memory may be volatile or non-volatile. Volatile electronic memory uses power to maintain data whereas non-volatile memory is able to store data without power. Phase change memory (PCM) is a type of nonvolatile memory in which a phase of a phase change element is employed to represent a unit of data. Phase change memory has fast read and write times, non-destructive reads, and high scalability. Phase change memory also has the potential to store multiple bits per cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a cross-sectional view of some embodiments of an integrated chip comprising the memory device of FIG. 1, 2A, 2B, 2C, 2D, or 2E arranged over a lower interconnect structure.

FIGS. 3B and 3C illustrate top views of some embodiments of the integrated chip of FIG. 3A.

DETAILED DESCRIPTION

Figure 1:
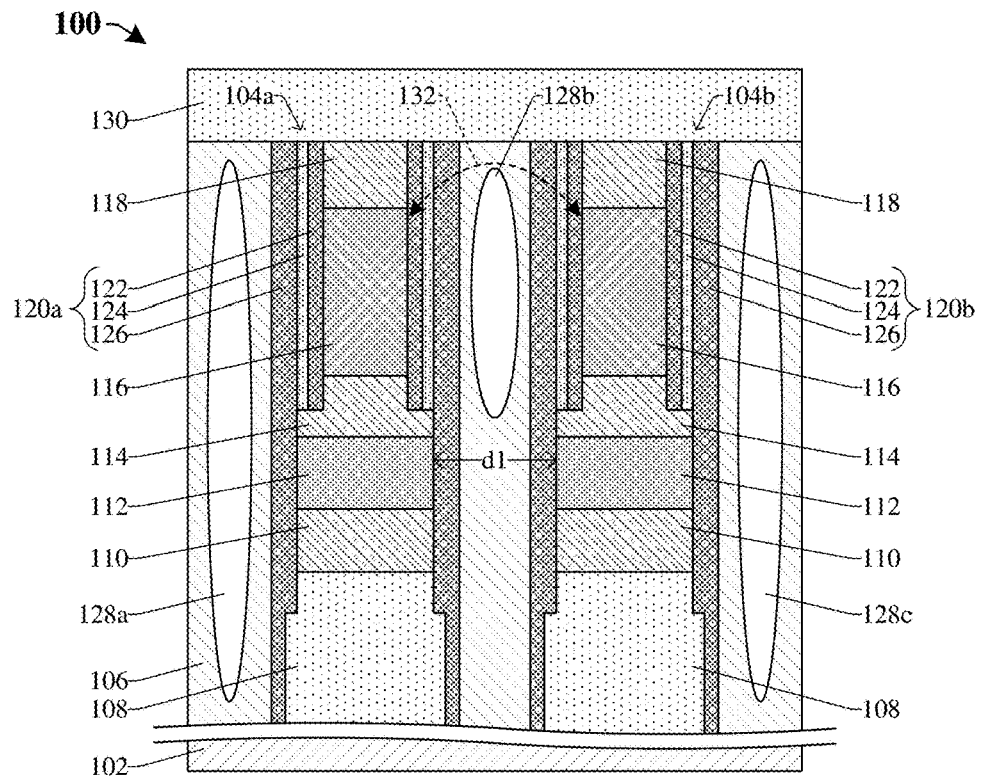
FIG. 1 illustrates a cross-sectional view of some embodiments of a memory device comprising an air gap disposed laterally between a first memory cell and a second memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device may include a plurality of phase change memory (PCM) cells disposed within a dielectric layer. The PCM cell includes a PCM material (e.g., germanium-antimony-tellurium) disposed between a first electrode and a second electrode. The PCM material has crystalline and amorphous phases with different electrical resistivity values, such that the PCM cell is configured to be switched between discrete data states. For example, the PCM cell may be reset (e.g., to a logical "0") by rapidly heating the PCM cell to a high temperature (e.g., by passing a high current across the PCM cell) and subsequently cooling the PCM cell shortly after heating it. The rapid heating and cooling causes the PCM material to be in the amorphous phase which, in turn, causes the PCM cell to be in a high resistance state. Further, the PCM cell can be set (e.g., to a logical "1") by heating the PCM cell to a moderate temperature (e.g., by passing a moderate current across the PCM cell) for an extended period of time. This causes the PCM material to be in the crystalline phase which, in turn, causes the PCM cell to be in a low resistance state. Thus, the switching operation of the PCM cell is dependent upon a temperature of the PCM cell.

In an effort to increase cell density, a distance between neighboring PCM cells is relatively small. However, because the dielectric layer between the neighboring PCM cells has a relatively high thermal conductivity (e.g., about 1.4 W/m*K), a high heat applied to a first PCM cell (e.g., during the reset process) may traverse the relatively small distance and unintentionally affect a performance and/or reliability of a second PCM cell adjacent to the first PCM cell. For example, due to the relatively high thermal conductivity of the dielectric layer, the high heat applied to the first PCM cell may heat and change the state of the neighboring second PCM cell (e.g., because some of the heat may travel through the dielectric layer from the first PCM cell to the second PCM cell). This phenomenon may be referred to as thermal crosstalk and may be exacerbated as the distance between neighboring PCM cells is decreased. The thermal crosstalk may adversely affect a performance and/or reliability of the second PCM cell and may reduce a performance and/or reliability of the first PCM cell because thermal confinement of the first PCM cell is also decreased.

Various embodiments of the present disclosure are directed towards a memory device comprising an air gap spaced laterally between a first memory cell and a second memory cell to reduce thermal crosstalk. The memory device includes a first word line and a second word line laterally adjacent to one another. A first memory cell overlies the first word line and a second memory cell overlies the second word line. A bit line continuously extends over both the first and second memory cells. A dielectric layer is disposed over the first and second word lines and laterally wraps around the first and second memory cells. An air gap is disposed within the dielectric layer and is spaced laterally between the first memory cell and the second memory cell. The air gap has a first thermal conductivity (e.g., about 0.024 W/m*K) that is less than a second thermal conductivity (e.g., about 1.4 W/m*K) of the dielectric layer, such that an overall thermal conductivity between the first and second memory cells is reduced. Accordingly, the air gap is configured to increase a thermal conduction path (i.e., a path in which heat travels) between the first and second memory cells, thereby mitigating heat conduction between the first and second memory cells. Thus, thermal crosstalk between the first and second memory cells is reduced, thereby increasing a performance and/or reliability of the memory device.

FIG. 1 illustrates a cross-sectional view of some embodiments of a memory device 100 comprising an air gap 128b disposed laterally between a first memory cell 104a and a second memory cell 104b.

The memory device 100 comprises a plurality of word lines 108 disposed over a semiconductor substrate 102. The plurality of word lines 108 are laterally separated from one another and continuously laterally extend in parallel with one another along a first direction. The first memory cell 104a and the second memory cell 104b overlie the plurality of word lines 108. A plurality of selectors 112 are disposed vertically between the word lines 108 and the first and second memory cells 104a, 104b. A first electrode 110 is disposed between each selector 112 and underlying word line 108. A bit line 130 overlies the first and second memory cells 104a, 104b and continuously laterally extends in a second direction perpendicular to the first direction. A first dielectric layer 106 is disposed between the bit line 130 and the word lines 108. The first dielectric layer 106 laterally encloses the first and second memory cells 104a, 104b.

The first and second memory cells 104a, 104b respectively comprise a second electrode 114, a third electrode 118, and a data storage layer 116 disposed vertically between the second electrode 114 and the third electrode 118. A first spacer structure 120a is disposed along sidewalls of the first memory cell 104a and a second spacer structure 120b is disposed along sidewalls of the second memory cell 104b. In some embodiments, the first spacer structure 120a continuously laterally wraps around a perimeter of the first memory cell 104a along a closed path and/or the second spacer structure 120b continuously laterally wraps around a perimeter of the second memory cell 104b along a closed path. The first and second spacer structures 120a, 120b respectively comprise a first spacer layer 122, a second spacer layer 124, and a third spacer layer 126. The second spacer layer 124 is disposed laterally between the first spacer layer 122 and the third spacer layer 126. In some embodiments, the first spacer layer 122 directly contacts outer sidewalls of the third electrode 118, outer sidewalls of the data storage layer 116, and inner sidewalls of the second electrode 114. In various embodiments, the second spacer layer 124 directly contacts outer sidewalls of the first spacer layer 122. In yet further embodiments, the third spacer layer 126 directly contacts outer sidewalls of the second electrode 114, outer sidewalls of the selector 112, outer sidewalls of the first electrode 110, and sidewalls of the word line 108.

A plurality of air gaps 128a-c is disposed within the first dielectric layer 106, where the plurality of air gaps 128a-c comprises a first air gap 128a, a second air gap 128b, and a third air gap 128c. In some embodiments, one or more surfaces of the first dielectric layer 106 form and/or define the first, second, and third air gaps 128a, 128b, 128c, and the first dielectric layer 106 may continuously extend in a closed loop around each air gap in the plurality of air gaps 128a-c. The first memory cell 104a is disposed laterally between the first air gap 128a and the second air gap 128b. The second memory cell 104b is disposed laterally between the second air gap 128b and the third air gap 128c. Further, the second air gap 128b is spaced laterally between the first memory cell 104a and the second memory cell 104b. The air gaps 128a-c may comprise air or the like and have a lower thermal conductivity than surrounding structures such as the first dielectric layer 106, the first spacer structure 120a, and the second spacer structure 120b. In various embodiments, the air gaps 128a-c may be referred to as voids, pores, openings, or the like.

In some embodiments, the data storage layers 116 of the first and second memory cells 104a, 104b respectively comprise a phase change memory (PCM) material such as chalcogenide material(s) that comprise at least one chalcogen ion (e.g., a chemical element in column VI of the period table), germanium antimony telluride (GST), another suitable phase-change alloy, or some other suitable material. Thus, the first and second memory cells 104a. 104b may respectively be configured as a PCM cell. In various embodiments, during operation of the memory device 100, the data storage layer 116 may vary between states depending upon a voltage applied across the memory cells 104a, 104b. The data storage layer 116 may be reset (e.g., to a logical "0") by heating the data storage layer 116 to a high temperature and subsequently cooling the data storage layer 116. This causes the data storage layer 116 to be in an amorphous phase, such that it may be in a high resistance state. Further, the data storage layer 116 may be set (e.g., to a logical "1") by heating the data storage layer 116 to a moderate temperature (e.g., that may be less than the high temperature used in the reset operation). This causes the data storage layer 116 to be in a crystalline phase, such that it may be in a low resistance state.

By virtue of the air gaps 128a-c having the lower thermal conductivity (e.g., less than thermal conductivities of the first dielectric layer 106 and the first and second spacer structures 120a-b), the air gaps 128a-c may reduce thermal crosstalk between the first and second memory cells 104a, 104b and other adjacent memory cells (not shown). For example, because the second air gap 128b is spaced laterally between the first and second memory cells 104a, 104b it reduces an overall thermal conductivity between the memory cells 104a, 104b and lengthens a heat conduction path 132 (i.e., a path in which heat travels) between the first memory cell 104a and the second memory cell 104b. This, in part, mitigates heat transfer between the first and second memory cells 104a, 104b during operation of the memory device 100 (e.g., mitigates the transfer of heat between the memory cells 104a. 104b that is generated during a reset operation or set operation). Therefore, by disposing the second air gap 128b between the first and second memory cells 104a, 104b thermal crosstalk between the first and second memory cells 104a, 104b may be decreased, thereby increasing an overall performance of the memory device 100 and reducing inconsistent data states in the first and second memory cells 104a.

In some embodiments, the air gaps 128a-c have an oval shape, a circular shape, a rectangular shape, or another suitable shape. Further, a size of the second air gap 128b may be less than a size of the first air gap 128a or a size of the third air gap 128c. In some embodiments, a top of the second air gap 128b is above top surfaces of the data storage layers 116 of the first and second memory cells 104a, 104b. In further embodiments, a bottom of the second air gap 128b is below bottom surfaces of the data storage layers 116 of the first and second memory cells 104a, 104b. The first air gap 128a and the third air gap 128c continuously vertically extend from above the data storage layers 116 to below a top surface of the word lines 108. In various embodiments, the heat conduction path 132 is greater than a distance d1 between the first memory cell 104a and the second memory cell 104b.

In some embodiments, the first dielectric layer 106 may be or comprise an oxide (e.g., silicon dioxide), silicon oxycarbide, another dielectric material, or any combination of the foregoing. The word lines 108 and/or the bit line 130 may, for example, be or comprise aluminum, copper, ruthenium, tungsten, titanium nitride, tantalum nitride, another conductive material, or any combination of the foregoing. The first, second, and third electrodes 110, 114, 118 may, for example, be or comprise titanium, tantalum, titanium nitride, tantalum nitride, tungsten, carbon, another conductive material, or any combination of the foregoing. The semiconductor substrate 102 may, for example, be or comprise silicon, a bulk substrate, monocrystalline silicon, a silicon-on-insulator (SOI) substrate, or the like.

In various embodiments, the selectors 112 may be or comprise a threshold type selector such as, for example, an ovonic threshold switch (OTS), or the like. The selectors 112 may, for example, comprise a PCM material such as chalcogenide material(s) that comprise at least one chalcogen ion (e.g., a chemical element in column VI of the period table), germanium antimony telluride (GST), another suitable phase-change alloy, or some other suitable material. In some embodiments, each selector 112 may have a threshold voltage that, if exceeded, allows current to flow through the selector 112, while if an applied voltage is less than the threshold voltage the selector 112 blocks current from flowing. In such embodiments, the selector 112 is configured to selectively block current from flowing through a corresponding memory cell 104a or 104b, such that the selector 112 is configured to selectively provide access to the corresponding memory cell 104a or 104b. In yet further embodiments, the selectors 112 may be referred to as switching structures and/or switching devices.

In some embodiments, the first spacer layer 122 and/or the third spacer layer 126 may be or comprise silicon nitride, silicon oxynitride, silicon carbide, some other suitable dielectric material, or any combination of the foregoing. In further embodiments, the second spacer layer 124 may be or comprise silicon dioxide, silicon oxycarbide, some other suitable dielectric material, or any combination of the foregoing. In yet further embodiments, the second spacer layer 124 and the first dielectric layer 106 may comprises a same material (e.g., silicon dioxide, silicon oxycarbide, or a combination of the foregoing).

The first spacer layer 122 has a first thermal conductivity (e.g., about 20 W/m*K), the second spacer layer 124 has a second thermal conductivity (e.g., within a range of about 0.5 to about 1.4 W/m*K), the third spacer layer 126 has a third thermal conductivity (e.g., about 20 W/m*K), the first dielectric layer 106 has a fourth thermal conductivity (e.g., within a range of about 0.5 to about 1.4 W/m*K), and the air gaps 128a-c have a fifth thermal conductivity (e.g., about 0.024 W/m*K). In various embodiments, the first thermal conductivity is greater than the second thermal conductivity, the second thermal conductivity is less than the third thermal conductivity, the third thermal conductivity is less than the fourth thermal conductivity, and the fourth thermal conductivity is less than the fifth thermal conductivity. In yet further embodiments, the first thermal conductivity is equal to the third thermal conductivity and/or the second thermal conductivity is equal to the fourth thermal conductivity. By virtue of a layout of the spacer layers 122-126 and air gaps 128a-c relative to the data storage layer 116 and the difference in thermal conductivities between the spacer layers 122-126, first dielectric layer 106, and air gaps 128a-c, a confinement of heat around/in the data storage layers 116 of the first and second memory cells 104a, 104b may be increased. This, in part, further decreased thermal cross talk and decreases a power consumption of the first and second memory cells 104a, 104b, thereby improving an overall performance of the memory device 100.

Figure 2A:
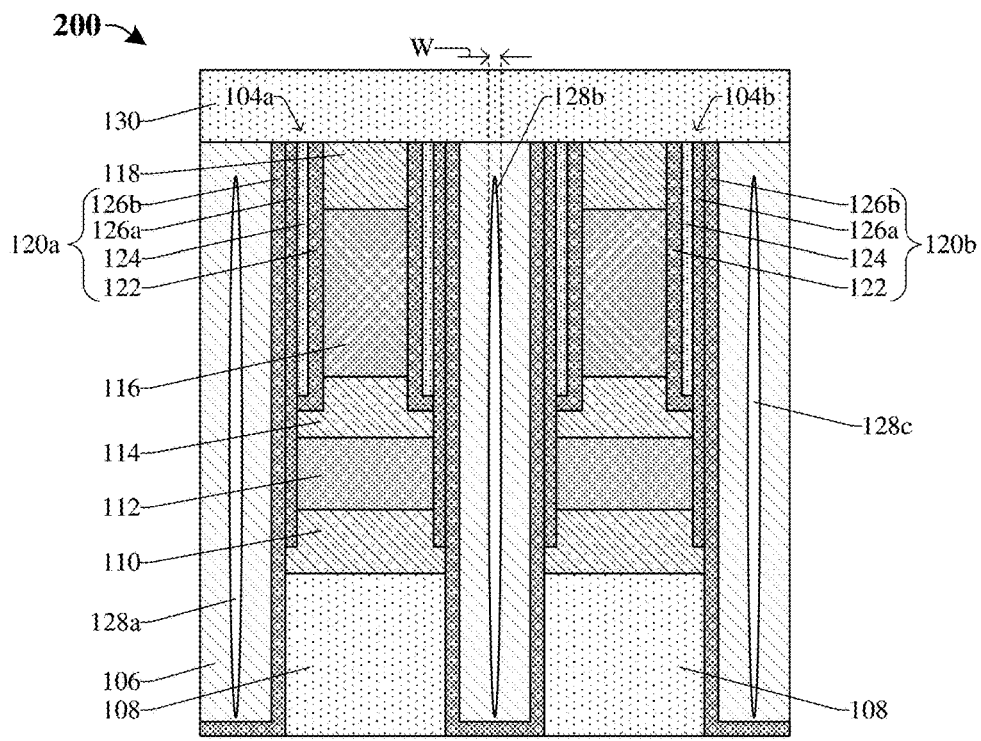
FIGS. 2A-2E illustrate cross-sectional views of different embodiments of the memory device of FIG. 1.

FIG. 2A illustrates a cross-sectional view of some embodiments of a memory device 200 corresponding to some alternative embodiments of the memory device 100 of FIG. 1.

In some embodiments, the third spacer layer 126 comprises a first outer spacer layer 126a and a second outer spacer layer 126b. The first outer spacer layer 126a continuously extends along and contacts opposing sidewalls of the second spacer layer 124, opposing sidewalls of the first spacer layer 122, opposing sidewalls of the second electrode 114, opposing sidewalls of the selector 112, and an upper surface and opposing inner sidewalls of the first electrode 110. The second outer spacer layer 126b continuously extends along and contacts opposing sidewalls of the first outer spacer layer 126a, outer opposing sidewalls of the first electrode 110, and opposing sidewalls of the word line 108. In various embodiments, the second outer spacer layer 126b continuously extends along a bottom surface of the first dielectric layer 106 and has a bottom surface that is aligned with a bottom surface of the word lines 108. The first and second outer spacer layers 126a, 126b may, for example, be or comprise silicon nitride, silicon oxynitride, silicon carbide, other suitable dielectric material, or any combination of the foregoing.

In further embodiments, the air gaps 128a-c have a same shape as one another and each have a width W. In some embodiments, the width W is about 3 nanometers (nm), within a range of about 2.5 to 3.5 nm, or another suitable value. In various embodiments, the width W of the second air gap 128b is less than a width of the first dielectric layer 106 disposed laterally between the first memory cell 104a and the second memory cell 104b. By virtue of the air gaps 128a-c having the width W (e.g., about 3 nm), a confinement of heat around/in the data storage layer 116 is increased and a likelihood of thermal crosstalk between the first memory cell 104a and the second memory cell 104b is decreased. This, in part, decreases a power consumption of the first and second memory cells 104a, 104b and increases a reliability and performance of the first and second memory cells 104a, 104b.

In some embodiments, outer opposing sidewalls of the word line 108 are aligned with outer opposing sidewalls of the first electrode 110. Inner opposing sidewalls of the first electrode 110 are aligned with outer opposing sidewalls of the selector 112. Outer opposing sidewalls of the selector 112 are aligned with outer opposing sidewalls of the second electrode 114. Inner opposing sidewalls of the second electrode 114 are aligned with outer opposing sidewalls of the data storage layer 116 and outer opposing sidewalls of the third electrode 118 are aligned with the outer opposing sidewalls of the data storage layer 116. In various embodiments, the first spacer layer 122 is L-shaped and continuously extends from the outer opposing sidewalls of the data storage layer 116 to an upper surface of the second electrode 114. In further embodiments, the first spacer layer 122 extends along a bottom surface of the second spacer layer 124. In yet further embodiments, the first outer spacer layer 126a directly contacts an upper surface of the first electrode 110.

Figure 2B:
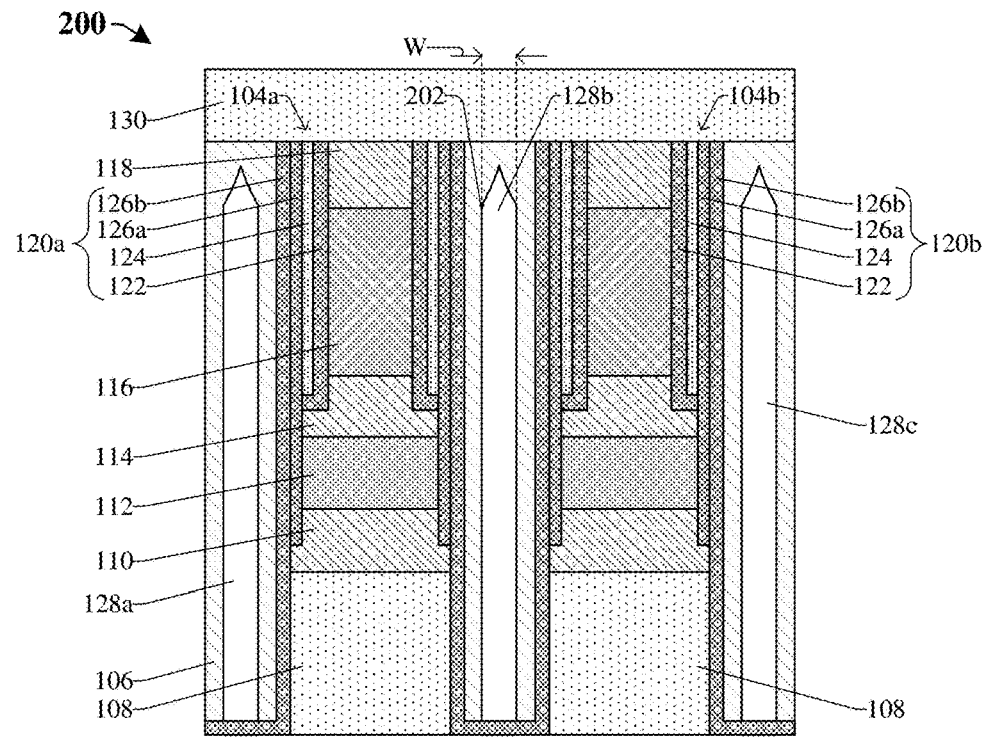

FIG. 2B illustrates a cross-sectional view of other embodiments of the memory device 200 of FIG. 2A, in which the air gaps 128a-c continuously vertically extend from above a top surface of the data storage layer 116 to an upper surface of the second outer spacer layer 126b. In some embodiments, a width W of the air gaps 128a-c continuously increases from a top of the air gaps 128a-c to a first point 202 in a direction towards the word lines 108, and the width W remains constant from the first point 202 to the upper surface of the second outer spacer layer 126b. In yet further embodiments, the first point 202 is above the top surface of the data storage layer 116. A maximum value of the width W may, for example, be about 9 nm, within a range of about 8 to 10 nm, or another suitable value. In various embodiments, by virtue of the width W being large (e.g., about 9 nm) between the first memory cell 104a and the second memory cell 104b, the likelihood of thermal crosstalk between the first and second memory cells 104a, 104b is further decreased. This further reduces the power consumption of the first and second memory cells 104a, 104b and further increases a reliability and performance of the first and second memory cells 104a, 104b.

Figure 2C:
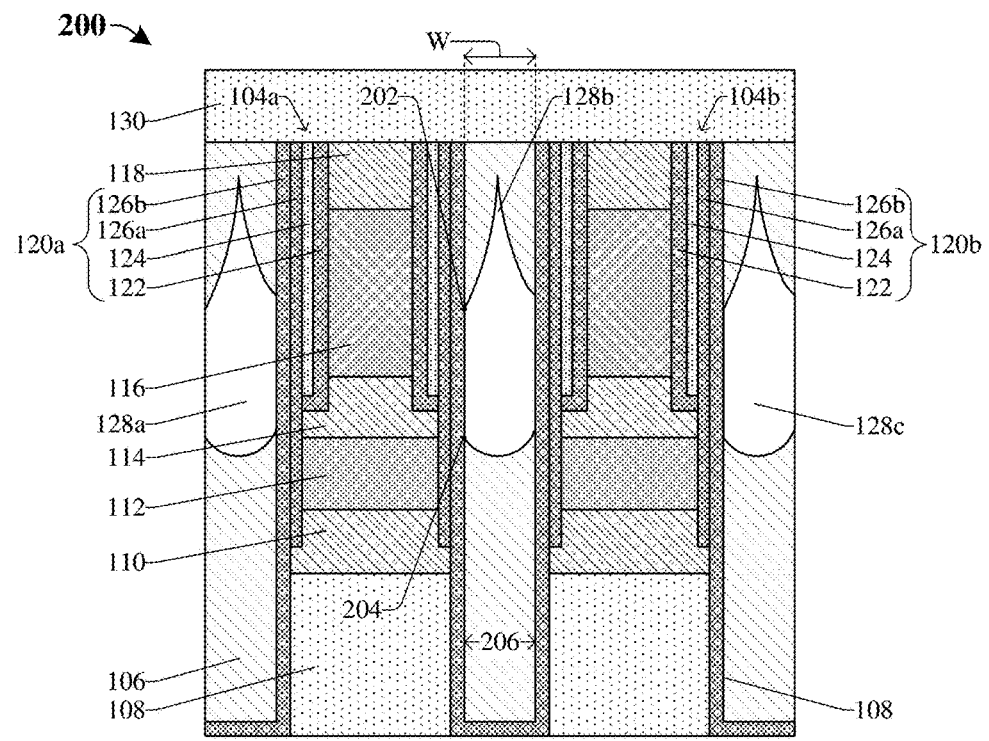

FIG. 2C illustrates a cross-sectional view of other embodiments of the memory device 200 of FIG. 2A, in which the air gaps 128a-c continuously vertically extend from above a top surface of the data storage layer 116 to below a bottom surface of the second electrode 114. Sides of the air gaps 128a-c may be defined by sidewalls of the first and second spacer structures 120a, 120b. In some embodiments, a width W of the air gaps 128a-c continuously increases from a top of the air gaps 128a-c to a first point 202 in a direction towards the word lines 108 and the width W remains constant from the first point 202 to a second point 204 below the data storage layer 116. A bottom of each air gap 128a-c is defined by a lower surface of the first dielectric layer 106 that may, for example, be curved and extend below a top surface of the selector 112. In some embodiments, the first point 202 is disposed below the top surface of the data storage layer 116 and/or the second point 204 is disposed below a bottom surface of the second electrode 114. In further embodiments, a maximum value of the width W may, for example, be about 19 nm, within a range of about 18 to 20 nm, or another suitable value. In various embodiments, a width 206 of the first dielectric layer 106 between the first and second memory cells 104a, 104b is equal to the maximum value of the width W of the second air gap 128b. In various embodiments, by virtue of the width W being relatively large (e.g., about 19 nm) between the first memory cell 104a and the second memory cell 104b, the likelihood of thermal crosstalk between the first and second memory cells 104a, 104b is further decreased. This further reduces the power consumption of the first and second memory cells 104a, 104b and further increases a reliability and performance of the first and second memory cells 104a, 104b.

Figure 2D:
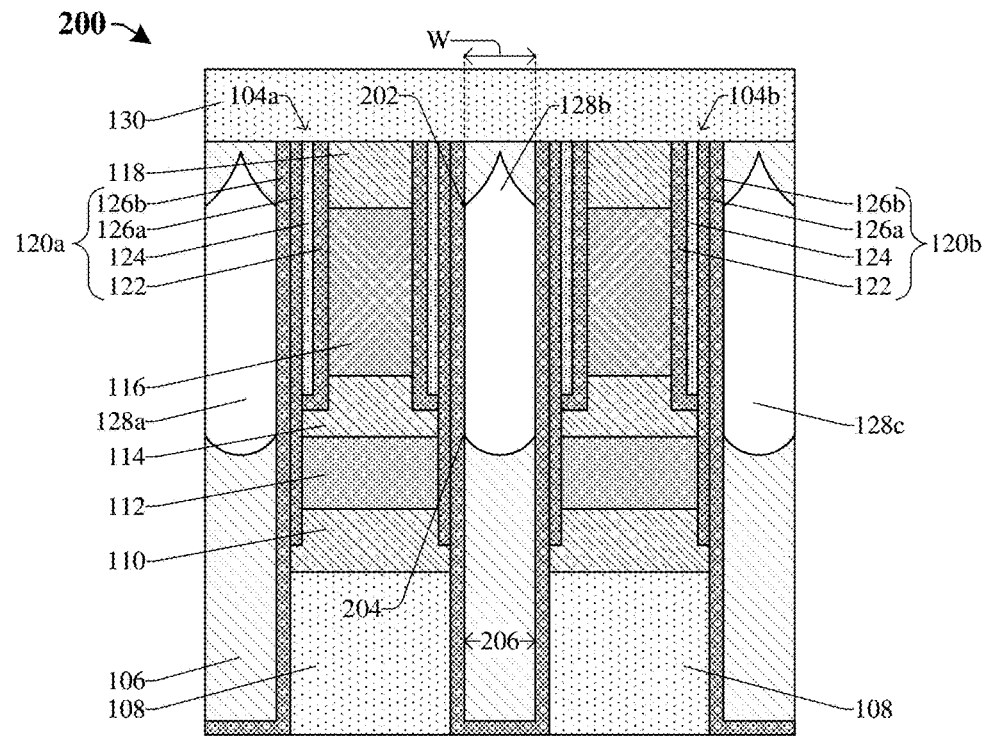

FIG. 2D illustrates a cross-sectional view of other embodiments of the memory device 200 of FIG. 2A, in which the air gaps 128a-c continuously vertically extend from above a top surface of the data storage layer 116 to below a bottom surface of the second electrode 114. Sides of the air gaps 128a-c may be defined by sidewalls of the first and second spacer structures 120a, 120b. In some embodiments, a width W of the air gaps 128a-c continuously increases from a top of the air gaps 128a-c to a first point 202 in a direction towards the word lines 108 and the width W remains constant from the first point 202 to a second point 204 below the data storage layer 116. A bottom of each air gap 128a-c is defined by a lower surface of the first dielectric layer 106 that may, for example, be curved and extend below a top surface of the selector 112. In some embodiments, the first point 202 is disposed above the top surface of the data storage layer 116 and/or the second point 204 is disposed below a bottom surface of the data storage layer 116. In further embodiments, a maximum value of the width W may, for example, be about 19 nm, within a range of about 18 to 20 nm, or another suitable value. In various embodiments, a width 206 of the first dielectric layer 106 between the first and second memory cells 104a, 104b is equal to the maximum value of the width W of the second air gap 128b. In various embodiments, by virtue of the width W being relatively large (e.g., about 19 nm) between the first memory cell 104a and the second memory cell 104b, the likelihood of thermal crosstalk between the first and second memory cells 104a, 104b is further decreased. This further reduces the power consumption of the first and second memory cells 104a, 104b and further increases a reliability and performance of the first and second memory cells 104a, 104b.

Figure 2E:
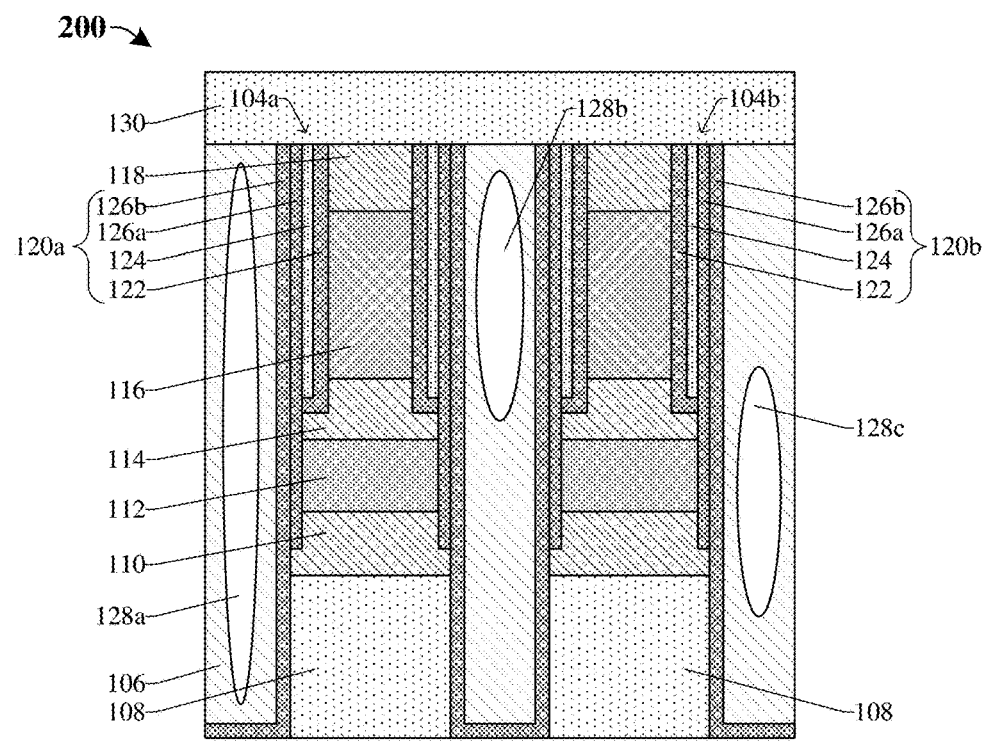

FIG. 2E illustrates a cross-sectional view of other embodiments of the memory device 200 of FIG. 2A, in which the air gaps 128a-c have different sizes, layouts, and/or shapes from one another.

FIG. 3A illustrates a cross-sectional view of some embodiments of an integrated chip 300 comprising a memory device 301 arranged over a lower interconnect structure 314. It will be appreciated that while the cross-sectional view of FIG. 3A illustrates a memory device 301 according to some embodiments of the memory device 200 of FIG. 2A, the memory device 301 may be configured as the memory device 100 or 200 of FIG. 1, 2B, 2C, 2D, or 2E.

In some embodiments, the integrated chip 300 comprises a plurality of semiconductor devices 302 disposed on/within the semiconductor substrate 102. The semiconductor devices 302 may, for example, be transistors or other suitable semiconductor device(s). An inter-level dielectric (ILD) layer 304 is disposed over the semiconductor substrate 102 and a plurality of conductive contacts 306 are disposed within the ILD layer 304 and are electrically coupled to one or more of the semiconductor devices 302. Further, the lower interconnect structure 314 overlies the semiconductor substrate 102. The lower interconnect structure 314 comprises a plurality of conductive wires 310 and a plurality of conductive vias 312 disposed within an inter-metal dielectric (IMD) structure 308. In various embodiments, the first and second memory cells 104a, 104b and the selectors 112 may be electrically coupled to one or more of the semiconductor devices 302 by way of one or more of the conductive wires 310, one or more of the conductive vias 312, and one or more of the conductive contacts 306.

FIG. 3B illustrates a top view of some embodiments of the integrated chip 300 of FIG. 3A taken along the line A-A'. For ease of illustration, the second outer spacer layer (126b of FIG. 3A) and portions of the first dielectric layer 106 are omitted from the top view of FIG. 3B to more easily illustrate a layout of the word lines 108 and an air gap 128.

As illustrated in FIG. 3B, in some embodiments, the air gap 128 has a grid structure when viewed from above such that the air gap 128 continuously laterally wrap around the first memory cell 104a and the second memory cell 104b. In such embodiments, the air gap 128 comprises the first air gap (128a of FIG. 3A), the second air gap (128b of FIG. 3A), and the third air gap (128c of FIG. 3A).

FIG. 3C illustrates a top view of other embodiments of the integrated chip 300 of FIG. 3A taken along the line A-A'. For ease of illustration, the second outer spacer layer (126b of FIG. 3A) and portions of the first dielectric layer 106 are omitted from the top view of FIG. 3C to more easily illustrate a layout of the word lines 108 and the air gaps 128a-c.

As illustrated in FIG. 3C, in some embodiments, the air gaps 128a-c continuously laterally extend in parallel with one another and the plurality of word lines 108. The air gaps 128a-c are laterally separated from one another by an individual word line in the plurality of word lines 108.

FIGS. 4-12 illustrate cross-sectional views 400-1200 of some embodiments of a method for forming a memory device comprising a first memory cell laterally separated from a second memory cell by an air gap. Although the cross-sectional views 400-1200 shown in FIGS. 4-12 are described with reference to a method, it will be appreciated that the structures shown in FIGS. 4-12 are not limited to the method but rather may stand alone separate of the method. Although FIGS. 4-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
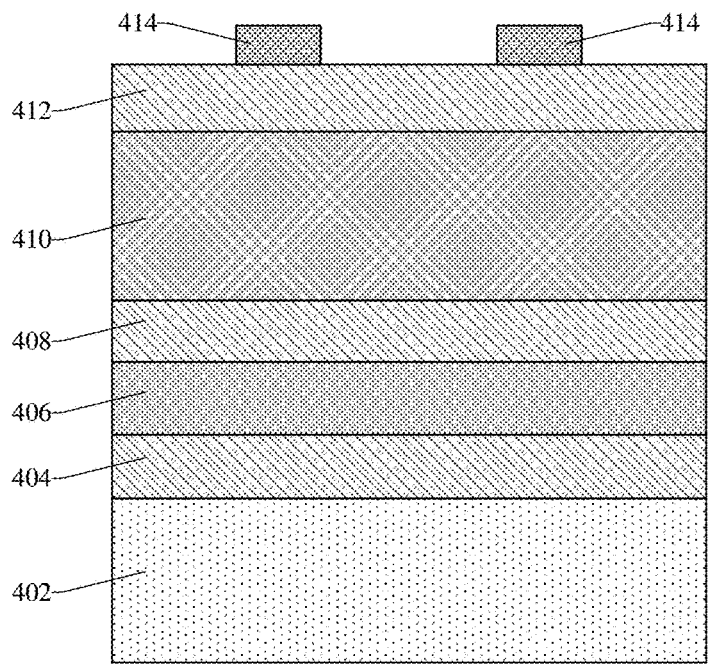
FIGS. 4-12 illustrate cross-sectional views of some embodiments of a method for forming a memory device comprising a first memory cell laterally separated from a second memory cell by an air gap.

As shown in the cross-sectional view 400 of FIG. 4, a first conductive layer 402 is formed over a semiconductor substrate (not shown), a second conductive layer 404 is formed over the first conductive layer 402, a switching layer 406 is formed over the second conductive layer 404, a third conductive layer 408 is formed over the switching layer 406, a data storage structure 410 is formed over the third conductive layer 408, and a fourth conductive layer 412 is formed over the data storage structure 410. Further, a masking layer 414 is formed over the fourth conductive layer 412.

In some embodiments, the first conductive layer 402 may, for example, be formed by chemical vapor deposition (CVD), physical vapor deposition (PVD), atomic layer deposition (ALD), electroplating, electroless plating, or some other suitable growth or deposition process. The first conductive layer 402 may, for example, be or comprise aluminum, copper, ruthenium, tungsten, titanium nitride, tantalum nitride, or the like. The second conductive layer 404 may, for example, be formed on the first conductive layer 402 by CVD, PVD, ALD, electroplating, electroless plating, or some other suitable growth or deposition process. The switching layer 406 may, for example, be formed on the second conductive layer 404 by CVD, PVD, ALD, or some other suitable growth or deposition process. The switching layer 406 may, for example, be or comprise tellurium, selenium, germanium, gallium, arsenic, boron, carbon, nitrogen, chalcogenide material(s), germanium antimony telluride (GST), some other suitable material, or any combination of the foregoing. The third conductive layer 408 may, for example, be formed on the switching layer 406 by CVD, PVD, ALD, electroplating, electroless plating, or some other suitable growth or deposition process. The data storage structure 410 may, for example, be formed on the third conductive layer 408 by CVD, PVD, ALD, or some other suitable growth or deposition process. The data storage structure 410 may, for example, be or comprise a phase change memory (PCM) material such as chalcogenide material(s) that comprise at least one chalcogen ion (e.g., a chemical element in column VI of the period table), germanium antimony telluride (GST), another suitable phase-change alloy, or some other suitable material. The fourth conductive layer 412 may, for example, be formed on the data storage structure 410 by CVD, PVD, ALD, electroplating, electroless plating, or some other suitable growth or deposition process. In various embodiments, the second, third, and fourth conductive layers 404, 408, 412 may, for example, be or comprise titanium, tantalum, titanium nitride, tantalum nitride, tungsten, carbon, another conductive material, or any combination of the foregoing.

Figure 5:
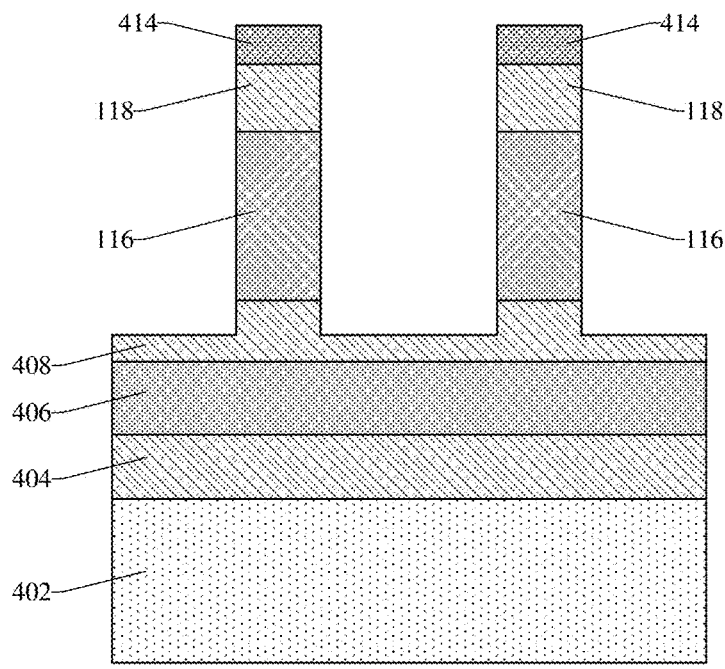

As shown in the cross-sectional view 500 of FIG. 5, a patterning process is performed on the fourth conductive layer (412 of FIG. 4), the data storage structure (410 of FIG. 4), and the third conductive layer 408 according to the masking layer 414, thereby forming third electrodes 118 and data storage layers 116. In various embodiments, the patterning process removes at least a portion of the third conductive layer 408 such that it has an upper surface below a bottom surface of the data storage layers 116. The patterning process may, for example, include performing a wet etch process, a dry etch process, or a combination of the foregoing. In yet further embodiments, a removal process (not shown) is performed after the patterning process to remove the masking layer 414.

Figure 6:
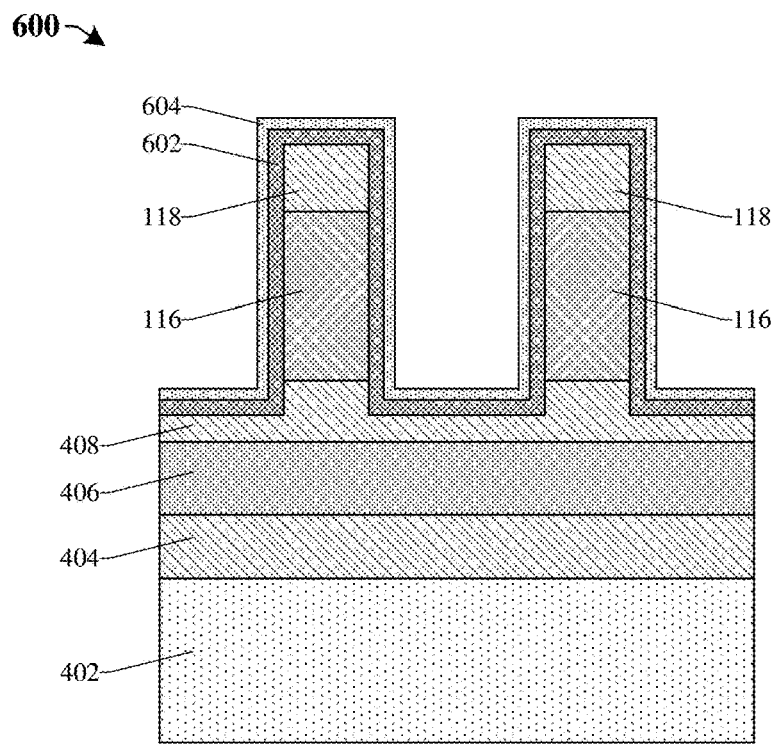

As shown in the cross-sectional view 600 of FIG. 6, a first spacer dielectric 602 is formed over the third conductive layer 408 and a second spacer dielectric 604 is formed over the first spacer dielectric 602. In some embodiments, the first spacer dielectric 602 is formed on the third conductive layer 408, sidewalls of the data storage layers 116, and the third electrodes 118 by CVD, PVD, ALD, or another suitable growth or deposition process. The first spacer dielectric 602 may, for example, be or comprise silicon nitride, silicon oxynitride, silicon carbide, some other suitable dielectric material, or any combination of the foregoing. In further embodiments, the second spacer dielectric 604 is formed on the first spacer dielectric 602 by CVD, PVD, ALD, or another suitable growth or deposition process. The second spacer dielectric 604 may, for example, be or comprise silicon dioxide, silicon oxycarbide, some other suitable dielectric material, or any combination of the foregoing.

Figure 7:
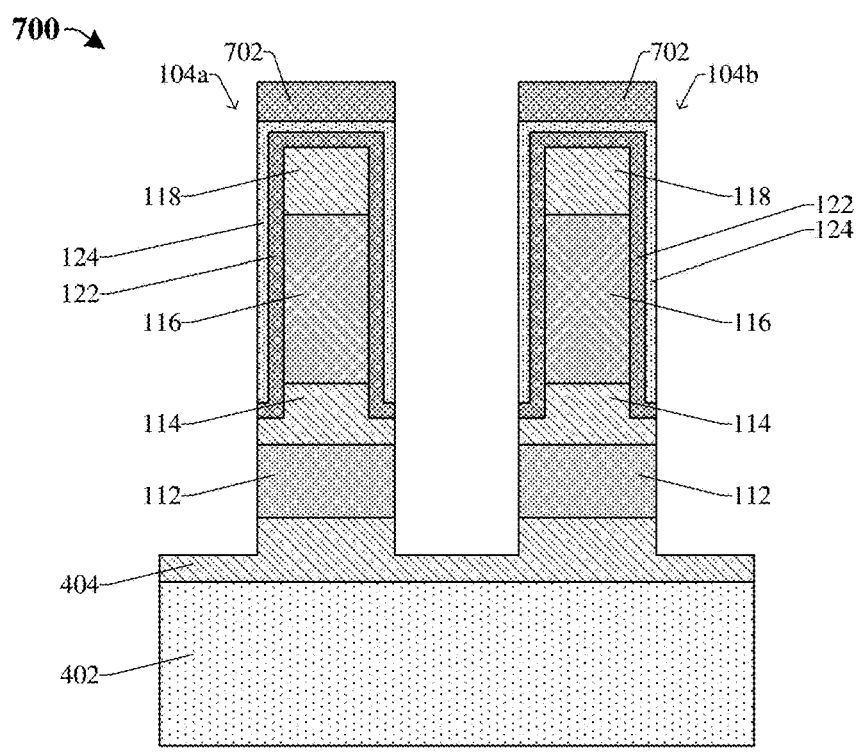

As shown in the cross-sectional view 700 of FIG. 7, a patterning process is performed on the first spacer dielectric (602 of FIG. 6), the second spacer dielectric (604 of FIG. 6), the third conductive layer (408 of FIG. 6), the switching layer (406 of FIG. 6), and the second conductive layer 404, thereby forming a first spacer layer 122, second spacer layer 124, second electrodes 114, selectors 112, a first memory cell 104a, and a second memory cell 104b. In various embodiments, the patterning process includes: forming a masking layer 702 over the third electrodes 118; exposing unmasked regions of the second spacer dielectric (604 of FIG. 6) and other underlying layers/structures to one or more etchants; and performing a removal process to remove the masking layer 702 (not shown). In some embodiments, the patterning process comprises performing a wet etch process and/or a dry etch process. The patterning process removes at least a portion of the second conductive layer 404.

In various embodiments, the first spacer layer 122 and the second spacer layer 124 are configured to protect the data storage layers 116 during the patterning process of FIG. 7 and subsequent processing steps. For example, by virtue of the first and second spacer layers 122, 124 overlying the data storage layers 116 and being disposed along sidewalls of the data storage layers 116, oxidation of the data storage layers 116 during the patterning process of FIG. 7 may be mitigated, thereby improving a performance and reliability of the first and second memory cells 104a, 104b.

Figure 8:
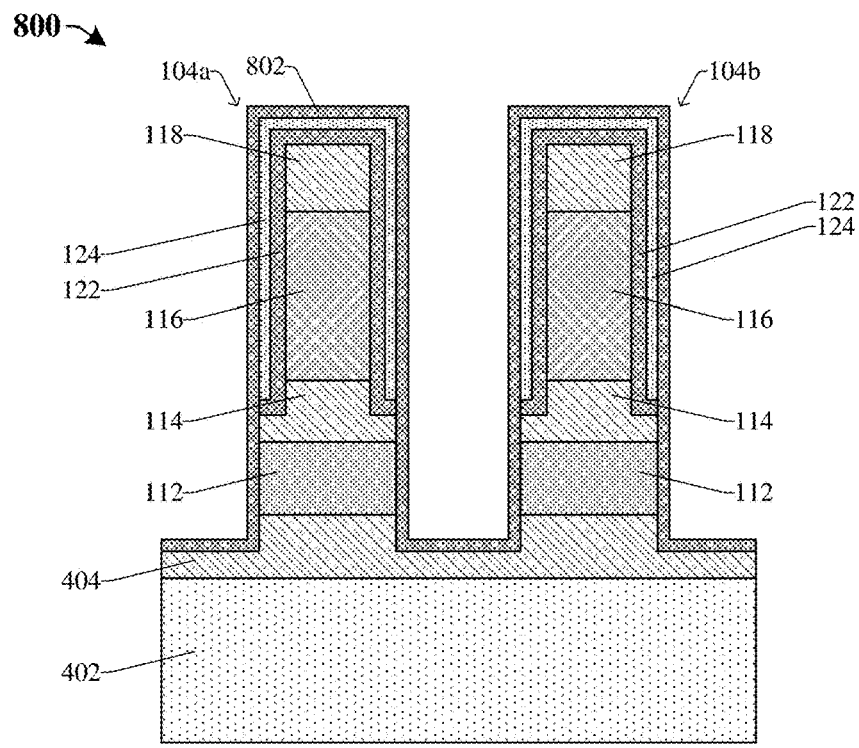

As shown in the cross-sectional view 800 of FIG. 8, a third spacer dielectric 802 is formed over the second spacer layer 124 and the second conductive layer 404. In some embodiments, the third spacer dielectric 802 is formed on the second spacer layer 124, the second electrodes 114, selectors 112, and the second conductive layer 404 by CVD, PVD, ALD, or another suitable growth or deposition process. The third spacer dielectric 802 may, for example, be or comprise silicon nitride, silicon oxynitride, silicon carbide, some other suitable dielectric material, or any combination of the foregoing.

Figure 9:
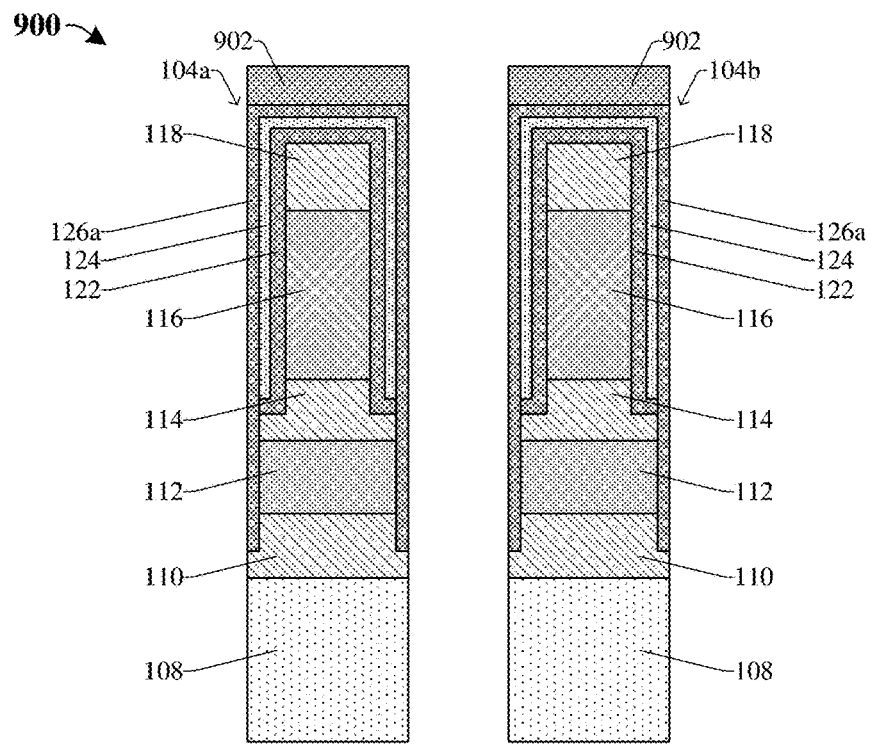

As shown in the cross-sectional view 900 of FIG. 9, a patterning process is performed on the third spacer dielectric (802 of FIG. 8), the second conductive layer (404 of FIG. 8), and the first conductive layer (402 of FIG. 8), thereby forming a first outer spacer layer 126a, first electrodes 110, and word lines 108. In various embodiments, the patterning process includes: forming a masking layer 902 over the third electrodes 118; exposing unmasked regions of the third spacer dielectric (802 of FIG. 8) and other underlying layers/structures to one or more etchants; and performing a removal process to remove the masking layer 902 (not shown). In some embodiments, the patterning process comprises performing a wet etch process and/or a dry etch process.

In various embodiments, the first outer spacer layer 126a is configured to protect the selectors 112 during the patterning process of FIG. 9 and subsequent processing steps. For example, by virtue of the first outer spacer layer 126a being disposed along sidewalls of the selectors 112, oxidation of the selectors 112 during the patterning process of FIG. 9 may be mitigated, thereby improving a performance and reliability of the first and second memory cells 104a, 104b.

Figure 10:
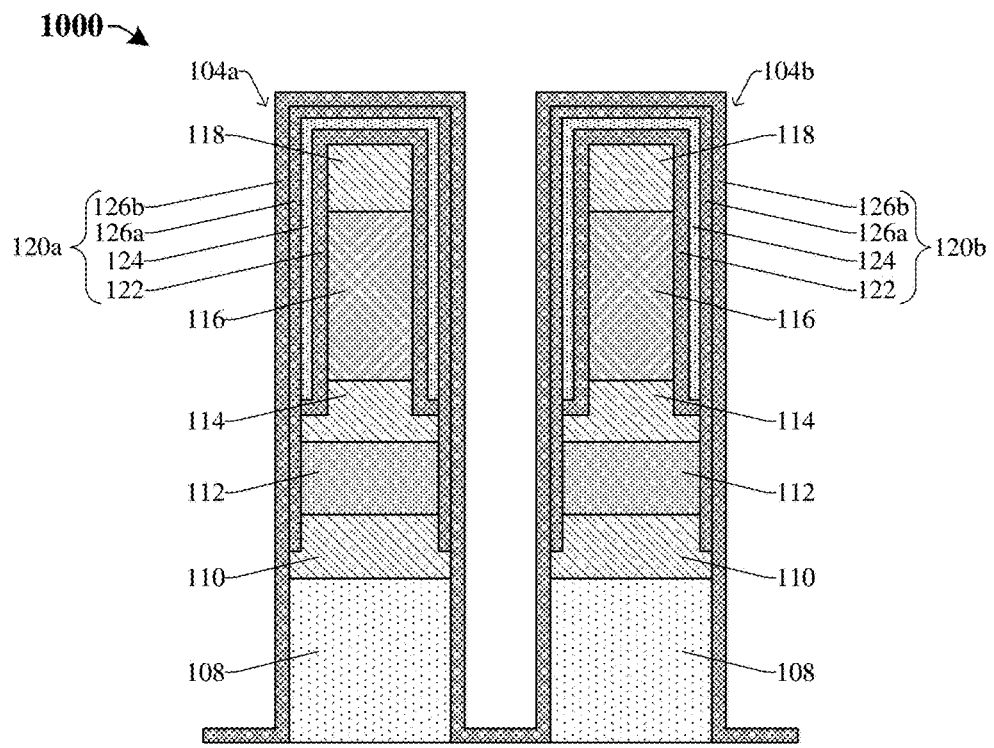

As shown in the cross-sectional view 1000 of FIG. 10, a second outer spacer layer 126b is formed over the first outer spacer layer 126a, thereby forming a first spacer structure 120a around the first memory cell 104a and a second spacer structure 120b around the second memory cell 104b. In some embodiments, the second outer spacer layer 126b is formed on the first outer spacer layer 126a, the first electrodes 110, and the word lines 108 by CVD, PVD, ALD, or another suitable growth or deposition process. The second outer spacer layer 126b may, for example, be or comprise silicon nitride, silicon oxynitride, silicon carbide, some other suitable dielectric material, or any combination of the foregoing. The second outer spacer layer 126b continuously laterally extends from the first memory cell 104a to the second memory cell 104b.

Figure 11A:
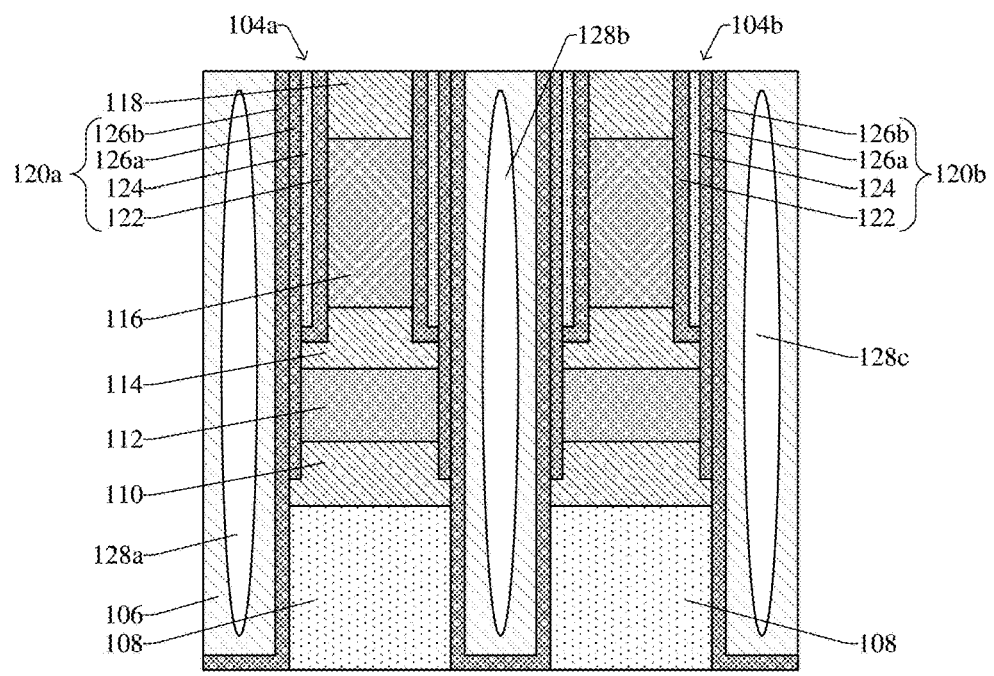

As shown in the cross-sectional view 1100a of FIG. 11A, a first dielectric layer 106 is formed over the second outer spacer layer 126b and between the first and second memory cells 104a, 104b such that a plurality of air gaps 128a-c are formed within the first dielectric layer 106. The first dielectric layer 106 laterally encloses the first memory cell 104a and the second memory cell 104b. In some embodiments, a process for forming the first dielectric layer 106 includes: depositing a dielectric material (e.g., silicon dioxide, silicon oxycarbide, some other dielectric, or a combination of the foregoing) on the second outer spacer layer 126b by ALD, CVD, or the like; and performing a planarization process (e.g., a chemical mechanical planarization (CMP) process) on the dielectric material, the first spacer structure 120a, and the second spacer structure 120b. In various embodiments, the planarization process is performed such that top surfaces of layers within the first and second spacer structures 120a, 120b are co-planar with a top surface of the first dielectric layer 106 and/or top surfaces of the third electrodes 118. In yet further embodiments, the air gaps 128a-c are formed within the first dielectric layer 106 due to the recesses disposed on opposing sides of the first and second memory cells 104a, 104b, the selected deposition process(es) (e.g., ALD and/or CVD), and/or fill properties of the dielectric material deposited.

Figure 11B:
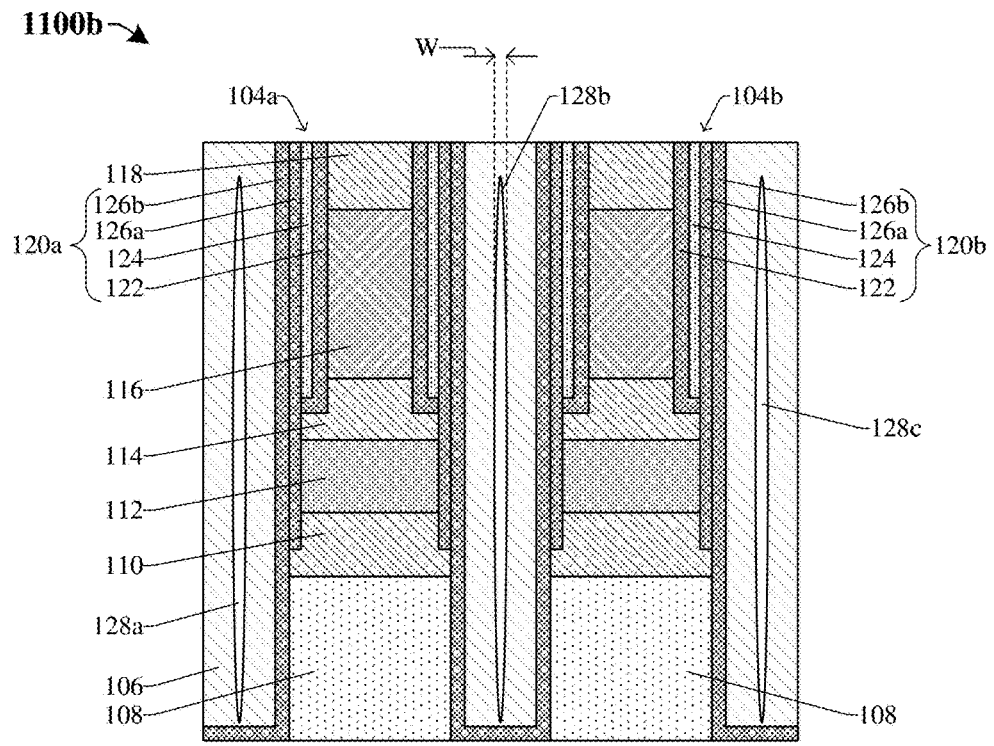

The cross-sectional view 1100b of FIG. 11B illustrates an alternative embodiment of the cross-sectional view 1100a of FIG. 11A, in which the first dielectric layer 106 is formed such that the air gaps 128a-c respectively have a width W that is about 3 nm, within a range of about 2.5 to 3.5 nm, or another suitable value. In some embodiments, the first dielectric layer 106 comprises silicon dioxide and silicon oxynitride and is deposited solely by one or more ALD processes. In some embodiments, by virtue of the first dielectric layer 106 being deposited solely by one or more ALD processes, the first dielectric layer 106 is formed such that the air gaps 128a-c have the shape and layout illustrated in FIG. 11B and the width W that is about 3 nm or another suitable value. In further embodiments, after depositing the first dielectric layer 106, a planarization process (e.g., a CMP process) is performed on the first dielectric layer 106, the first spacer structure 120a, and the second spacer structure 120b such that top surfaces of the aforementioned layers are co-planar.

Figure 11C:
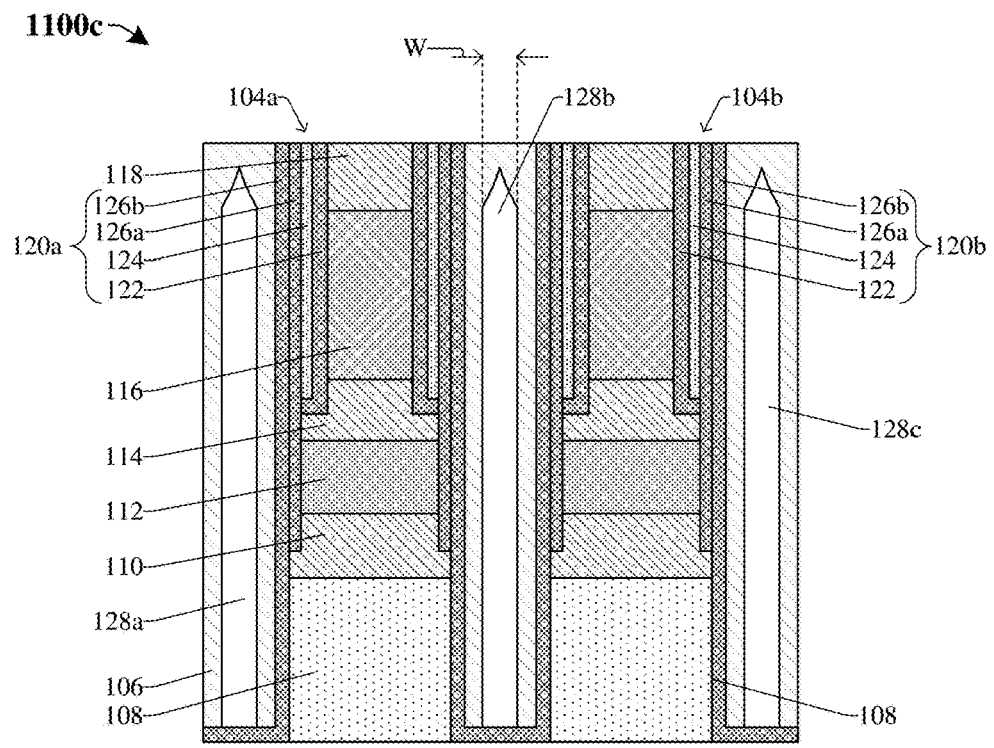

The cross-sectional view 1100c of FIG. 11C illustrates an alternative embodiment of the cross-sectional view 1100a of FIG. 11A, in which the first dielectric layer 106 is formed such that bottoms of the air gaps 128a-c are defined by an upper surface of the second outer spacer layer 126b. In various embodiments, the air gaps 128a-c respectively have a width W that is about 9 nm, within a range of about 8 to 10 nm, or another suitable value. In some embodiments, a process for forming the first dielectric layer 106 includes: performing a first deposition process (e.g., an ALD process) to conformally form a dielectric material (e.g., silicon dioxide) over the second outer spacer layer 126b; and performing a second deposition process (e.g., a flowable CVD process) to form additional dielectric material (e.g., silicon dioxide) over the second outer spacer layer 126b. In various embodiments, the first deposition process is an ALD process and the second deposition process is a flowable CVD process. In some embodiments, by virtue of the first dielectric layer 106 being deposited by the first deposition followed by the second deposition process, the first dielectric layer 106 is formed such that the air gaps 128a-c have the shape and layout illustrated in FIG. 11C and the width W that is about 9 nm or another suitable value. In further embodiments, after depositing the first dielectric layer 106, a planarization process (e.g., a CMP process) is performed on the first dielectric layer 106, the first spacer structure 120a, and the second spacer structure 120b such that top surfaces of the aforementioned layers are co-planar.

Figure 11D:
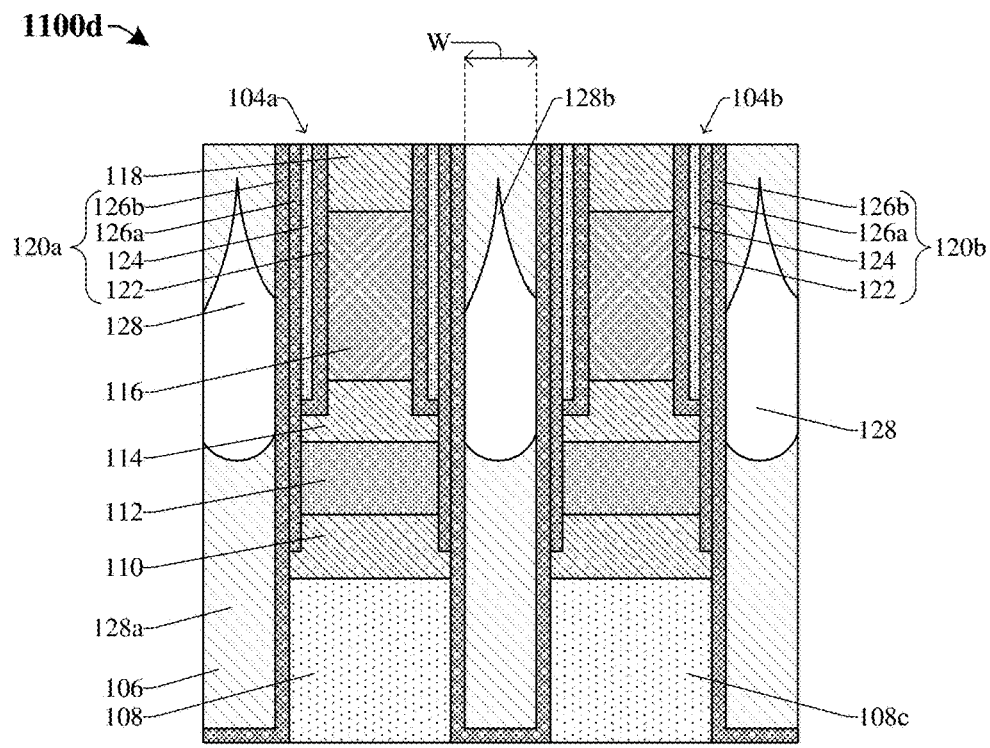

The cross-sectional view 1100d of FIG. 11D illustrates an alternative embodiment of the cross-sectional view 1100a of FIG. 11A, in which the first dielectric layer 106 is formed such that sides of the air-gaps 128a-c are defined by the second outer spacer layer 126b. In various embodiments, the air gaps 128a-c respectively have a width W that is about 19 nm, within a range of about 18 to 20 nm, or another suitable value. In some embodiments, a process for forming the first dielectric layer 106 includes: performing a first deposition process (e.g., a flowable CVD process) to form a dielectric material (e.g., silicon dioxide) over the second outer spacer layer 126b; and performing a second deposition process (e.g., a CVD process) to form additional dielectric material (e.g., silicon dioxide) over the second outer spacer layer 126b. In various embodiments, the first deposition process is a flowable CVD process and the second deposition process is a CVD process. In some embodiments, by virtue of the first dielectric layer 106 being deposited by the first deposition followed by the second deposition process, the first dielectric layer 106 is formed such that the air gaps 128*a-c* have the shape and layout illustrated in FIG. 11D and the width W that is about 19 nm or another suitable value. In further embodiments, after depositing the first dielectric layer 106, a planarization process (e.g., a CMP process) is performed on the first dielectric layer 106, the first spacer structure 120*a*, and the second spacer structure 120*b* such that top surfaces of the aforementioned layers are co-planar.

Figure 11E:
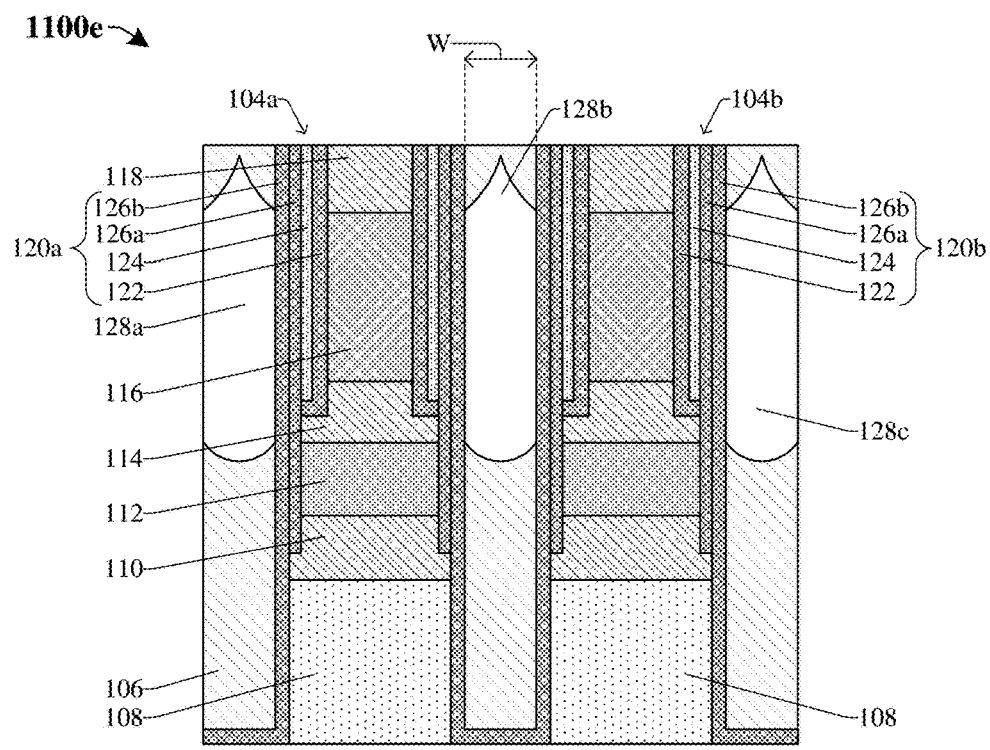

The cross-sectional view 1100*e* of FIG. 11E illustrates an alternative embodiment of the cross-sectional view 1100*a* of FIG. 11A, in which the first dielectric layer 106 is formed such that sides of the air-gaps 128*a-c* are defined by the second outer spacer layer 126*b*. In various embodiments, the air gaps 128*a-c* respectively have a width W that is about 19 nm, within a range of about 18 to 20 nm, or another suitable value. In some embodiments, a process for forming the first dielectric layer 106 includes: performing a first deposition process (e.g., a flowable CVD process) to form a dielectric material (e.g., silicon dioxide) over the second outer spacer layer 126*b*; and performing a second deposition process (e.g., a CVD process) to form additional dielectric material (e.g., silicon dioxide) over the second outer spacer layer 126*b*. In various embodiments, the first deposition process is a flowable CVD process and the second deposition process is a CVD process. In some embodiments, by virtue of the first dielectric layer 106 being deposited by the first deposition followed by the second deposition process, the first dielectric layer 106 is formed such that the air gaps 128*a-c* have the shape and layout illustrated in FIG. 11E and the width W that is about 19 nm or another suitable value. In further embodiments, after depositing the first dielectric layer 106, a planarization process (e.g., a CMP process) is performed on the first dielectric layer 106, the first spacer structure 120*a*, and the second spacer structure 120*b* such that top surfaces of the aforementioned layers are co-planar.

Figure 12:
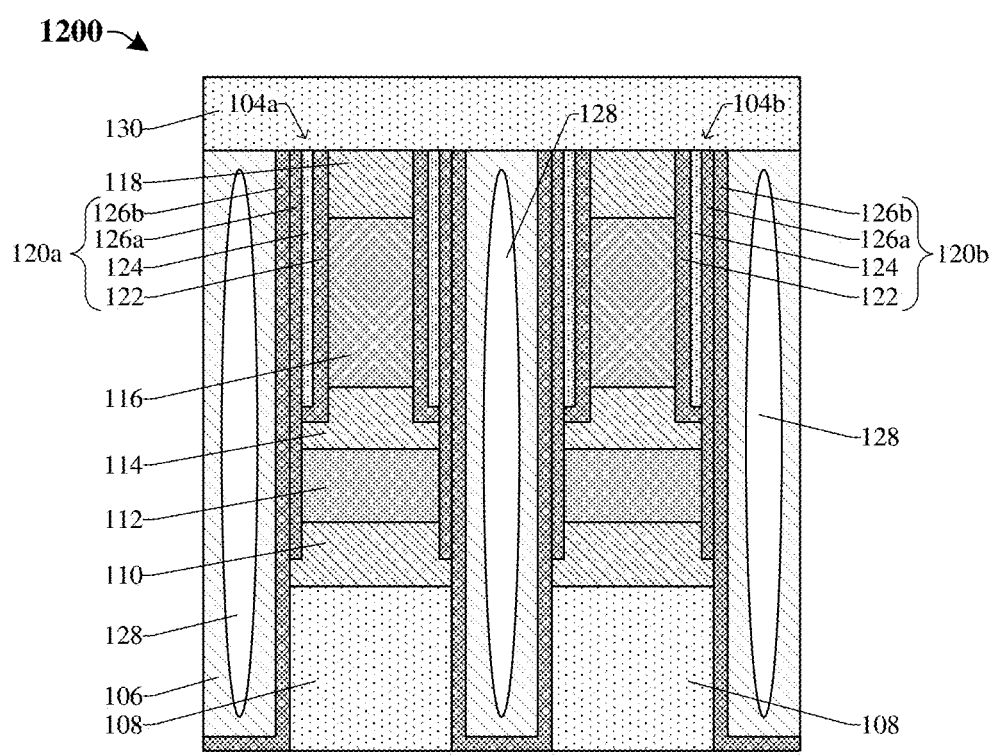

As shown in the cross-sectional view 1200 of FIG. 12, a bit line 130 is formed over the first and second memory cells 104*a*, 104*b*. The bit line 130 may, for example, be or comprise aluminum, copper, ruthenium, tungsten, titanium nitride, tantalum nitride, or the like. In some embodiments, a process for forming the bit line 130 may comprise: depositing (e.g., by CVD, PVD, ALD, electroplating, electroless plating, or the like) an upper conductive layer over the first dielectric layer 106; and patterning the upper conductive layer.

Figure 13:
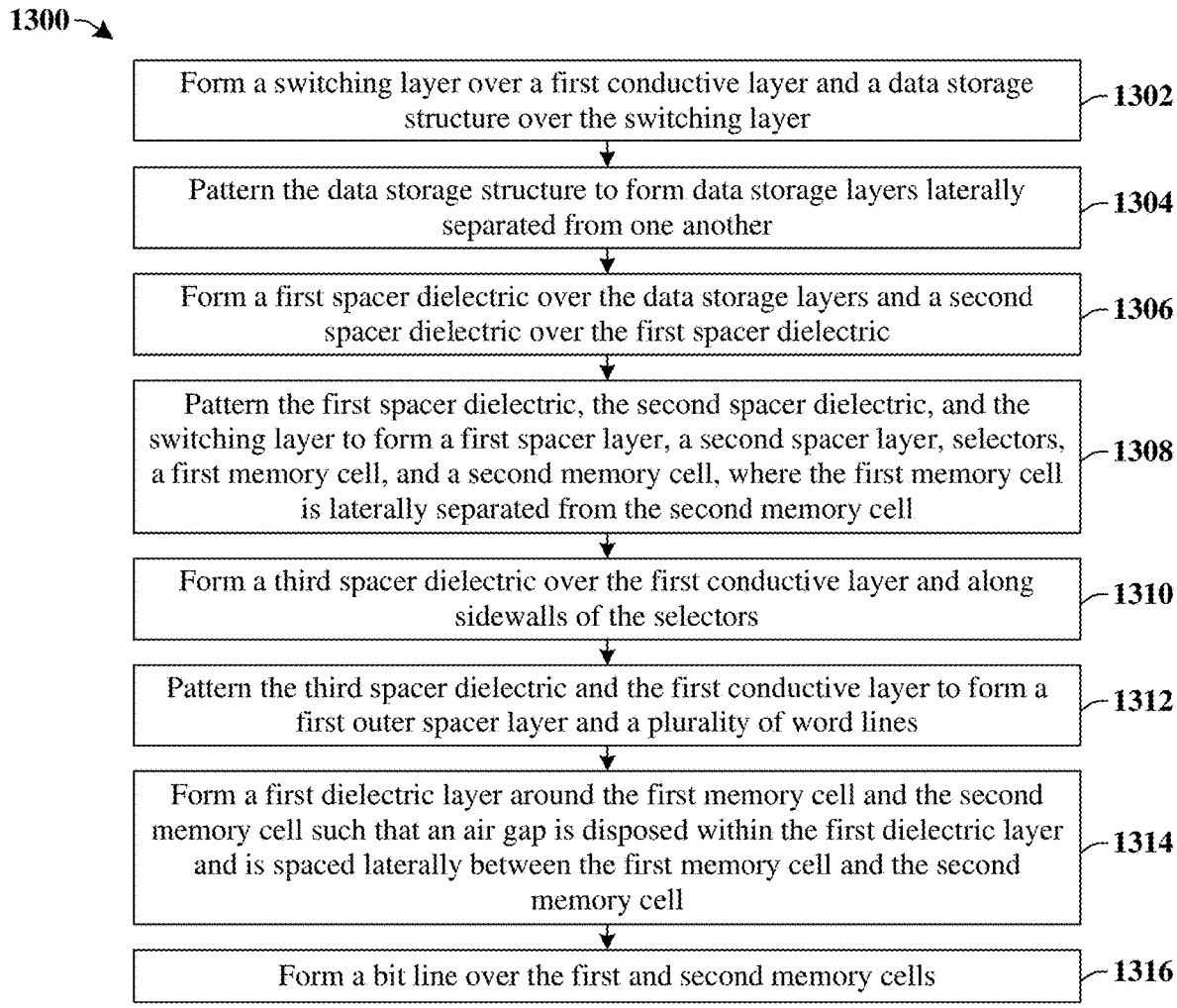
FIG. 13 illustrates a flow diagram of some embodiments of a method for forming a memory device comprising a first memory cell laterally separated from a second memory cell by an air gap.

FIG. 13 illustrates a flow diagram of some embodiments of a method 1300 for forming a memory device comprising a first memory cell laterally separated from a second memory cell by an air gap. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a switching layer is formed over a first conductive layer and a data storage structure is formed over the switching layer. FIG. 4 illustrates a cross-sectional view 400 corresponding to some embodiments of act 1302.

At act 1304, the data storage structure is patterned to form data storage layers laterally separated from one another. FIG. 5 illustrates a cross-sectional view 500 corresponding to some embodiments of act 1304.

At act 1306, a first spacer dielectric is formed over the data storage layers and a second spacer dielectric is formed over the first spacer dielectric. FIG. 6 illustrates a cross-sectional view 600 corresponding to some embodiments of act 1306.

At act 1308, the first spacer dielectric, the second spacer dielectric, and the switching layer are patterned to form a first spacer layer, a second spacer layer, selectors, a first memory cell, and a second memory cell, where the first memory cell is laterally separated from the second memory cell. FIG. 7 illustrates a cross-sectional view 700 corresponding to some embodiments of act 1308.

At act 1310, a third spacer dielectric is formed over the first conductive layer and along sidewalls of the selectors. FIG. 8 illustrates a cross-sectional view 800 corresponding to some embodiments of act 1310.

At act 1312, the third spacer dielectric and the first conductive layer are patterned to form a first outer spacer layer and a plurality of word lines. FIG. 9 illustrates a cross-sectional view 900 corresponding to some embodiments of act 1312.

At act 1314, a first dielectric layer is formed around the first memory cell and the second memory cell such that an air gap is disposed within the first dielectric layer and is spaced laterally between the first memory cell and the second memory cell. FIG. 11A illustrates a cross-sectional view 1100*a* corresponding to some embodiments of act 1314. FIGS. 11B through 11E illustrate cross-sectional views 1100*b*-1100*e* corresponding to various alternative embodiments of act 1314.

At act 1316, a bit line is formed over the first and second memory cells. FIG. 12 illustrates a cross-sectional view 1200 corresponding to some embodiments of act 1316.

Accordingly, in some embodiments, the present application relates to a memory device that comprises a first memory cell and a second memory cell disposed within a first dielectric layer, where an air gap is disposed within the first dielectric layer and is spaced laterally between the first and second memory cells.

In various embodiments, the present application provides an integrated chip, including: a first memory cell overlying a substrate, wherein the first memory cell comprises a first data storage layer; a second memory cell adjacent to the first memory cell; and a dielectric layer disposed laterally between the first memory cell and the second memory cell; and an air gap disposed within the dielectric layer, wherein the air gap is spaced laterally between the first memory cell and the second memory cell.

In various embodiments, the present application provides an integrated chip, including: a plurality of word lines overlying a substrate; a first phase change memory (PCM) cell and a second PCM cell overlying the plurality of word lines, wherein the first and second PCM cells include a data storage layer; sidewall spacers disposed on the first and second PCM cells, wherein the sidewall spacers include a first spacer layer extending along sidewalls of the first and second PCM cells; a dielectric layer disposed between the word lines and the first and second PCM cells, wherein a thermal conductivity of the dielectric layer is less than a thermal conductivity of the first spacer layer; and a first air gap disposed within the dielectric layer and between the first PCM cell and the second PCM cell, wherein a top of the first air gap is disposed above a top surface of the data storage layer.

In various embodiments, the present application provides a method for forming a memory device, the method including: depositing a data storage structure over a first conductive layer; patterning the data storage structure to form data storage layers over the first conductive layer; depositing a first spacer dielectric over the first conductive layer and on sidewalls of the data storage layers; patterning the first spacer dielectric to form a first spacer layer, a first memory cell, and a second memory cell, wherein the first memory cell is spaced from the second memory cell; patterning the first conductive layer to form a plurality of word lines below the first and second memory cells; and forming a dielectric layer between the first and second memory cells such that an air gap is disposed within the dielectric layer, wherein the air gap is spaced laterally between the first memory cell and the second memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
   depositing a data storage structure over a first conductive layer;
   patterning the data storage structure to form data storage layers over the first conductive layer;
   depositing a first spacer dielectric over the first conductive layer and on sidewalls of the data storage layers;
   patterning the first spacer dielectric to form a first spacer layer, a first memory cell, and a second memory cell, wherein the first memory cell is spaced from the second memory cell;
   patterning the first conductive layer to form a plurality of word lines below the first and second memory cells; and
   forming a dielectric layer between the first and second memory cells such that an air gap is disposed within the dielectric layer, wherein the air gap is spaced laterally between the first memory cell and the second memory cell.

2. The method of claim 1, wherein the first spacer layer has a thermal conductivity greater than a thermal conductivity of the dielectric layer.

3. The method of claim 1, wherein forming the dielectric layer comprises:
   performing a first deposition process to deposit dielectric material between the first and second memory cells; and
   performing a second deposition process to deposit additional dielectric material over the dielectric material.

4. The method of claim 3, wherein the first deposition process is an ALD process and the second deposition process is a CVD process.

5. The method of claim 3, wherein the dielectric layer is formed such that the air gap continuously vertically extends from above a top surface of the data storage layers to below a top surface of the word lines.

6. The method of claim 1, further comprising:
   depositing a selector layer between the first and second memory cells and the plurality of word lines; and
   patterning the selector layer to form a first selector under the first memory cell and a second selector under the second memory cell.

7. The method of claim 6, wherein a width of the first selector is greater than a width of a first data storage layer in the data storage layers.

8. The method of claim 6, wherein a bottom surface of the first spacer layer is above top surfaces of the first and second selectors.

9. The method of claim 1, wherein the air gap continuously extends around an outer perimeter of the first memory cell.

10. A method for forming an integrated chip, the method comprising:
    forming a first memory cell and a second memory cell over a semiconductor substrate, wherein the first and second memory cells respectively comprise a lower electrode, a data storage layer on the lower electrode, and an upper electrode on the data storage layer;
    forming a first sidewall spacer layer along sidewalls of the data storage layers of the first and second memory cells;
    forming a second sidewall spacer layer on sidewalls of the first sidewall spacer layer;
    forming a third sidewall spacer layer on sidewalls of the second sidewall spacer layer, wherein thermal conductivities of the first and third sidewall spacer layers are greater than a thermal conductivity of the second sidewall spacer layer; and
    depositing a dielectric layer around the first and second memory cells, wherein an air gap is arranged in the dielectric layer adjacent to the first memory cell.

11. The method of claim 10, wherein a thermal conductivity of the dielectric layer is less than the thermal conductivities of the first and third sidewall spacer layers.

12. The method of claim 10, wherein a height of the air gap is greater than a height of the first memory cell.

13. The method of claim 10, wherein forming the first and second memory cells comprises:
    depositing a lower electrode layer over the semiconductor substrate;
    depositing a data storage structure over the lower electrode layer;
    depositing an upper electrode layer over the data storage structure;
    performing a first etching process on the upper electrode layer and the data storage structure, thereby defining the upper electrodes and the data storage layers of the first and second memory cells; and
    performing a second etching process on the lower electrode layer, thereby defining the lower electrodes of the first and second memory cells.

14. The method of claim 13, wherein the first and second sidewall spacer layers are formed after the first etching process and before the second etching process, and the third sidewall spacer layer is formed after the second etching process.

15. The method of claim 10, wherein a width of the air gap between the first and second memory cells is equal to a width of a segment of the dielectric layer between the first and second memory cells.

16. A method for forming an integrated chip, the method comprising:
- depositing a stack of layers over a semiconductor substrate, wherein the stack of layers comprises a first electrode layer, a selector layer on the first electrode layer, a second electrode layer on the selector layer, a data storage structure on the second electrode layer, and a third electrode layer on the data storage structure;
- performing a first patterning process on the third electrode layer and the data storage structure, thereby defining a top electrode and a data storage layer under the top electrode;
- forming a first sidewall spacer layer and a second sidewall spacer layer along sidewalls of the data storage layer;
- performing a second patterning process on the second electrode layer, the selector layer, and the third electrode layer, thereby defining a middle electrode, a selector, and a bottom electrode, wherein the selector is between the middle electrode and the bottom electrode; and
- forming a dielectric layer over the semiconductor substrate, wherein the dielectric layer comprises an air gap adjacent to the data storage layer.

17. The method of claim 16, wherein a bottom of the air gap is above a bottom surface of the selector and a top of the air gap is below a top surface of the top electrode.

18. The method of claim 16, wherein a top of the air gap is defined by curved upper surfaces of the dielectric layer.

19. The method of claim 16, wherein outer sidewalls of the second sidewall spacer layer are aligned with outer sidewalls of the selector.

20. The method of claim 16, wherein the data storage layer comprises a chalcogenide material.

* * * * *